US009293636B2

(12) United States Patent
Cheung et al.

(10) Patent No.: US 9,293,636 B2
(45) Date of Patent: Mar. 22, 2016

(54) SOLAR CELL PAD DRESSING

(71) Applicant: Flextronics AP, LLC, Broomfield, CO (US)

(72) Inventors: Dason Cheung, Fremont, CA (US); Murad Kurwa, San Jose, CA (US); Richard Loi, San Jose, CA (US); Tor Krog, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 121 days.

(21) Appl. No.: 13/953,538

(22) Filed: Jul. 29, 2013

(65) Prior Publication Data

US 2014/0034708 A1 Feb. 6, 2014

Related U.S. Application Data

(63) Continuation-in-part of application No. 13/564,568, filed on Aug. 1, 2012.

(51) Int. Cl.
*B23K 1/00* (2006.01)
*B23K 1/018* (2006.01)
*H01L 31/18* (2006.01)
(Continued)

(52) U.S. Cl.
CPC ............ *H01L 31/186* (2013.01); *B23K 1/0016* (2013.01); *B23K 1/0056* (2013.01); *B23K 1/018* (2013.01); *B23K 1/203* (2013.01); *B23K 3/00* (2013.01); *B23K 3/029* (2013.01); *B23K 3/08* (2013.01); *B23K 37/00* (2013.01); *H05K 13/0465* (2013.01); *H05K 13/0486* (2013.01); *H01L 2924/0002* (2013.01); *H05K 3/225* (2013.01); *H05K 3/3494* (2013.01); *Y02E 10/50* (2013.01)

(58) Field of Classification Search
CPC .. B23K 1/018; B23K 1/0056; B23K 2201/42; B23K 3/029; B23K 1/0016; B23K 1/203; B23K 2201/36; B23K 37/00; B23K 3/00; B23K 3/033; B23K 3/0615; B23K 3/08
USPC ........................................................ 228/51
See application file for complete search history.

(56) References Cited

U.S. PATENT DOCUMENTS 3,259,293 A * 7/1966 Dezzani ...................... 228/20.5
4,530,456 A * 7/1985 Michelotti ................... 228/102

(Continued)

FOREIGN PATENT DOCUMENTS

JP     02081497 A  *  3/1990
JP     08300181 A  *  11/1996

OTHER PUBLICATIONS

JP 08300181 A computer english translation.*

*Primary Examiner* — Erin Saad
(74) *Attorney, Agent, or Firm* — Haverstock & Owens LLP

(57) ABSTRACT

A process for dressing a solder pad removes excess solder from locations that should be free of solder, such as circuit traces, other solder pads, and components near the solder pad being dressed. A first area of a substrate comprises solder to be removed and is heated to a first temperature. A second area of the substrate is heated to a second temperature. A vacuum nozzle is heated to a third temperature sufficient to melt the solder and is scanned across the area to be dressed, melting and vacuuming away the excess solder. The scanning process is controlled using a computer numerical controlled (CNC) machine.

12 Claims, 14 Drawing Sheets

(51) Int. Cl.
    *B23K 3/02*           (2006.01)
    *B23K 37/00*         (2006.01)
    *B23K 1/005*        (2006.01)
    *B23K 3/08*           (2006.01)
    *B23K 1/20*           (2006.01)
    *B23K 3/00*           (2006.01)
    *H05K 13/04*        (2006.01)
    *H05K 3/22*          (2006.01)
    *H05K 3/34*          (2006.01)

(56) References Cited

U.S. PATENT DOCUMENTS

| | | |
|---|---|---|
| 4,752,025 A | 6/1988 | Stach et al. |
| 5,409,543 A | 4/1995 | Panitz et al. |
| 5,598,965 A | 2/1997 | Scheu |
| 5,770,835 A | 6/1998 | Sakuyama et al. |
| 6,110,322 A | 8/2000 | Tech et al. |
| 6,152,353 A | 11/2000 | Sani Bakhitari |
| 6,336,990 B1 | 1/2002 | Tanaka et al. |
| 6,360,940 B1 | 3/2002 | Bolde et al. |
| 6,840,743 B2 | 1/2005 | Herke et al. |
| 2002/0134422 A1 | 9/2002 | Bauman et al. |
| 2003/0000936 A1 | 1/2003 | Kim et al. |
| 2003/0025906 A1* | 2/2003 | Sheffer .............. 356/237.5 |
| 2006/0008759 A1 | 1/2006 | Shiozawa |
| 2006/0273141 A1 | 12/2006 | Saito et al. |
| 2009/0308430 A1 | 12/2009 | Everett et al. |
| 2012/0012645 A1 | 1/2012 | Motomura et al. |
| 2012/0273559 A1 | 11/2012 | Patterson |

\* cited by examiner

Section A-A

Section A-A

SOLAR CELL PAD DRESSING

RELATED APPLICATIONS

This application is a Continuation-in-Part of the co-pending non-provisional U.S. patent application Ser. No. 13/564,568, filed Aug. 1, 2012, and entitled "VACUUM REFLOW VOIDING REWORK SYSTEM", which is hereby incorporated by reference in its entirety.

FIELD OF THE INVENTION

The present invention relates to the field of reworking of photovoltaic (solar) modules. More specifically, the present invention relates to precision redressing of a solar module solder pad, particularly after reworking the solder pad to reduce or remove solder voids in the solder pad.

BACKGROUND OF THE INVENTION

A solar cell module comprises a solar cell die soldered to a substrate. A known defect in the manufacturing of solar cell modules is the presence of voids in the solder between the solar cell die and the substrate. Voids in the solder can introduce at least two problems in a solar cell module. First, the solder contact area between the solar cell die and the substrate is reduced by the sum total of all void areas in the solder. The reduction in contact area increases the current density present in the solder that electrically couples the solar cell die to the substrate. Second, in concentrated photovoltaic (CPV) systems, light is focused onto a solar cell die to maximize solar energy conversion. In CPV systems, the concentration of light also concentrates substantial heat onto the solar cell die, through the die to the solder, from the solder to the substrate, and to an underlying sheet metal plane. A solder void comprises an atmosphere that reduces the thermal heat transfer area and increases the junction temperature. The increased junction temperature requires the use of heat sinks to keep the solar cell cool, otherwise the operating efficiency of the solar cell will drop significantly. The reduction in contact area further exacerbates the heating due to increased current density and can result in solar cell module failure.

To address these problems, it is preferable to control the area of any single solder void to less than 1% of the total solder area between the solar cell die and the substrate. It is further preferable to control the total area of voids to less than 5% of the total solder area between the solar cell die and the substrate.

Reworking of a solar cell module to remove or reduce the solder voids can involve reflowing of the solder connection between the die and the substrate. Reflowing of the solder can produce undesired effects such as the flowing of solder to areas of the substrate beyond the area of contact between the solar cell die and the substrate, to adjacent solder pads for other components or other circuit traces. Remediation, or "dressing" of the soldering pad requires precise positioning of solder removal equipment and precise temperature control of the solder removal equipment, to avoid damage to surrounding components, traces, and solder pads for other components. The prior art methods of dressing a solder pad use hand-held tools that are not sufficiently precise to avoid damaging components, traces, and other solder pads near the solder pad to be dressed. The prior art methods are especially poor when physical access to the solder pad to be reworked is limited and the size of the hand-held tools is large compared to the access area to the pad to be dressed.

SUMMARY OF THE INVENTION

To reduce the presence of solder voids in a solar cell module, between a solar cell die and substrate to which the die is soldered, the solar cell module can be reworked in a vacuum chamber. The reworking comprises applying heat to melt some or all of the solder encompassing a solder void, inside of a sealed chamber to which a vacuum is applied. The sealed chamber is preferably formed, at least in part, by one of the substrate and a cowling into which the solar cell module is mounted. The vacuum pulls out air in the void, termed degassing, thereby collapsing the void by raffling the solder into the void area. Vacuum reflow voiding rework systems and methods can also be applied to other types of electronic components that are similarly soldered to a substrate, particularly components that are subject to high heat build-up due to current density, such as a land grid array (L.G.A.) integrated circuit surface mount package and a quad-flat no-leads (QF) integrated circuit surface mount package. The systems and methods can also be utilized for non-electronic components where reduction or elimination of voids in a solder joint is needed.

After vacuum reflow voiding of the solder connection, precision dressing of a solar module solder pad is accomplished by precision control of a plurality of heating elements, a vacuum source that removes excess solder located in areas that should be free of solder, and precision control of these elements using a stepper motor assembly controlled by a computer numeric controlled (CNC) machine.

In a first aspect, a method of reducing solder voids in a module comprises heating solder to a predetermined temperature and applying a vacuum to a sealed chamber. The module comprises a component soldered to a substrate that is mounted in a cowling and coupled to a heat source, the module is coupled to a vacuum source, and the method is practiced in a sealed chamber formed at least in part by the cowling. In a preferred embodiment, the predetermined temperature is a melting point of the solder. The heat source is able to be heated to a temperature before coupling the heat source to the substrate. The method preferably further comprises lowering a vacuum cover down onto the cowling, thereby forming the sealed chamber from the cowling, the vacuum cover, and the substrate. In some embodiments, heating the solder comprises heating an area of the solder that substantially encompasses a void in the solder. In other embodiments, heating the solder comprises heating substantially all of the solder, such as after applying the vacuum to the chamber. In some embodiments, the vacuum pressure is modulated. In still other embodiments, the method further comprises applying a pressure to one of the component and the substrate such that solder is under a compressive force.

In a second aspect, a computer-readable medium is programmed with processor-executable instructions implementing any of the above methods of reducing solder voids in a module comprising a component soldered to a substrate.

In a third aspect, a system for reducing solder voids in a module comprises a sealed chamber comprising the module and a vacuum cover, a heat source coupled to the sealed chamber, and a vacuum source coupled to the sealed chamber. The module comprises a component soldered to a substrate and mounted in a cowling. In a preferred embodiment, the heat source is retractable from the sealed chamber. In such embodiments, the heat source is able to be preheated before coupling the heat source to the sealed chamber. The heat source is configured to apply heat to one of the substrate and the solder such that at least a portion of the solder is melted. In some embodiments, the heat source comprises a plurality of heat modules. In such embodiments, the plurality of heat modules are individually controllable. The vacuum source can be configured to produce a modulated vacuum within the chamber. In a preferred embodiment, the vacuum source is adjustable. In a preferred embodiment, the system further comprises a heat sensor array configured to detect a temperature of at least a portion of one of the component, the substrate, and the solder. Preferably, the system further comprises a control system operatively coupled to the heat source and the vacuum source, the control system comprising a processor and a memory configured to control the heat source and the vacuum source. In some embodiments, the control system can be configured to control retraction of the heat source.

In a fourth aspect a method of removing excess solder from an area on a surface of a substrate, using a machine comprising an X-Y translation stage, comprises heating a vacuum nozzle having a tip to a first temperature that is equal to or greater than a melting temperature of the solder, applying a vacuum to the vacuum nozzle, positioning the tip of the vacuum nozzle at substantially the surface of the substrate, and scanning a first area on the substrate. In a preferred embodiment, the method further comprises heating to a second temperature a second area of the substrate that substantially encompasses the first area. The method can further comprise heating substantially all of the remainder of the substrate to a third temperature. In some embodiments, the first area is predetermined. The first area can be predetermined by an operator of a machine that is configured to implement the method. In a preferred embodiment, the first area is predetermined by a machine configured to implement the method. In some embodiments, the first area is predetermined by a machine configured to implement the method, by analyzing an image of the substrate. Scanning the first area preferably comprises the machine translating the vacuum nozzle at least in the X-Y plane.

In a fifth aspect, the invention comprises a non-transitory computer-readable medium programmed with instructions implementing any of the above methods.

In a sixth aspect, a system is configured to remove excess solder from a first area of a substrate. The system comprises a vacuum nozzle configured to be coupled to an X-Y translation stage. The vacuum nozzle is fluidly coupled to a vacuum source and is coupled to a heating source. The system further comprises a controller configured to heat the vacuum nozzle to a first temperature, apply a vacuum source to the vacuum nozzle, and control the X-Y translation stage to scan the first area. The translation stage preferably comprises a computer numeric control (CNC) machine. In a preferred embodiment, the system further comprises a heat source configured to be thermally coupled to the area of the substrate from which solder is to be removed. In another preferred embodiment, the heat source comprises a plurality of heat source modules. Each heat source module is independently controllable and monitorable. In some embodiments, at least one of the plurality of heat source modules is configured to heat the area of the substrate to a second temperature. Preferably, at least one of the plurality of heat source modules is configured to heat a second area of the substrate, different from the first area, to a third temperature. In some embodiments, the controller is further configured to receive an image encompassing the substrate and analyze the image to determine the first area. In a preferred embodiment, the controller is further configured to receive input specifying the first area. In some embodiments, the system is configured to receive the input from an operator of the system.

Throughout the disclosure, reference is made to a solar module comprising a solar cell die soldered to a substrate. One skilled in the art will recognize that the disclosure applies generally to any component soldered to a substrate having a solder void, such as a diode array soldered to a substrate.

DETAILED DESCRIPTION OF THE DRAWINGS

In the detailed description of the drawings that follows, the embodiments described are intended to illustrate features of the presently claimed invention. Similar labels refer to similar or identical elements.

Figure 1A:
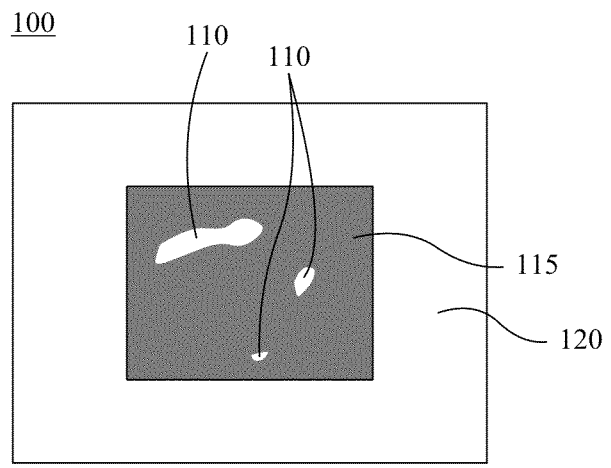
FIG. 1A illustrates a solar cell module having a solder void as is known in the art.
Figure 1B:
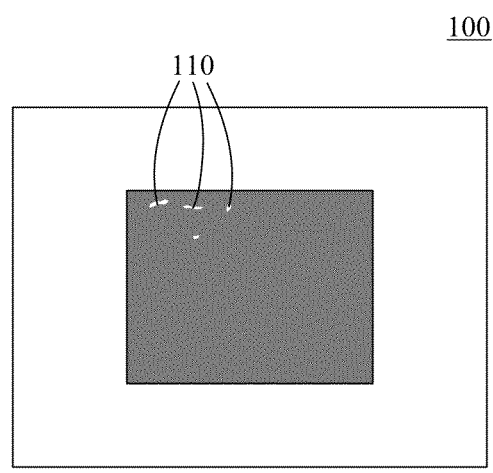
FIG. 1B illustrates a solar cell module after reworking in accordance with an embodiment of the presently claimed invention.

FIG. 1A illustrates a solar cell module 100 having one or more solder voids 110 as is known in the art. The solar cell module 100 comprises a solar cell die (not shown) soldered 115 to a substrate 120. FIG. 1B illustrates the solar cell module 100 after reworking in accordance with an embodiment of the presently claimed invention. In FIG. 1B, the solder voids 110 are substantially reduced or eliminated.

Figure 2A:
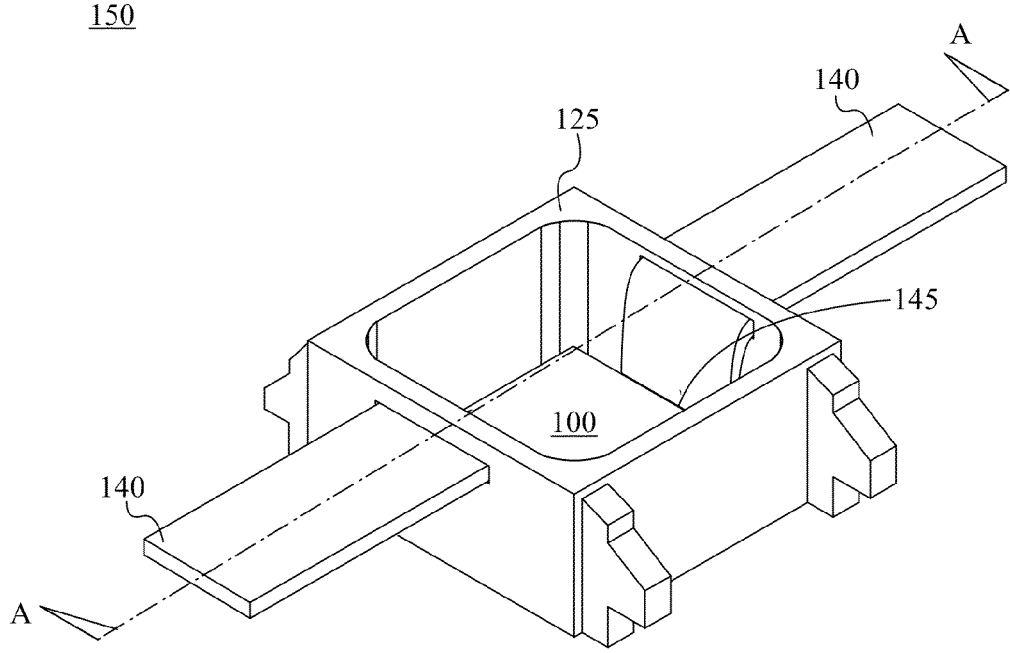
FIG. 2A illustrates a solar cell module installed in a cowling according to some embodiments.

FIG. 2A illustrates a mounted solar cell module 150 comprising a solar cell module 100 installed in a cowling 125 according to some embodiments. A conductor 140 enters the cowling 125 from each of two opposing sides. The conductor 140 is soldered 145 to a contact on the solar cell module 100. Systems and methods of soldering the conductor 140 to the contact on the solar cell module 100 are disclosed in copending U.S. patent application Ser. No. 13/564,452, entitled "Hot Bar Soldering", filed on Aug. 1, 2012, which is hereby incorporated by reference in its entirety for all purposes.

Figure 2B:
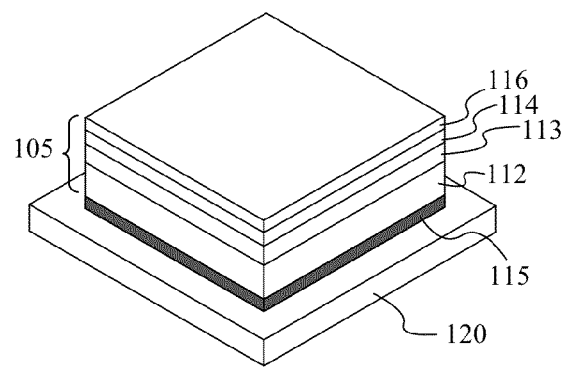
FIG. 2B illustrates a solar cell module as is known in the art.

FIG. 2B illustrates an example solar cell module 100 as is known in the art. A typical solar cell module 100 comprises a solar cell die 105 soldered 115 to a substrate 120. The solar cell die 105 further comprises a P-layer 112, an N-layer 113, a front grid 114, and an anti-reflective coating 116.

Figure 2C:
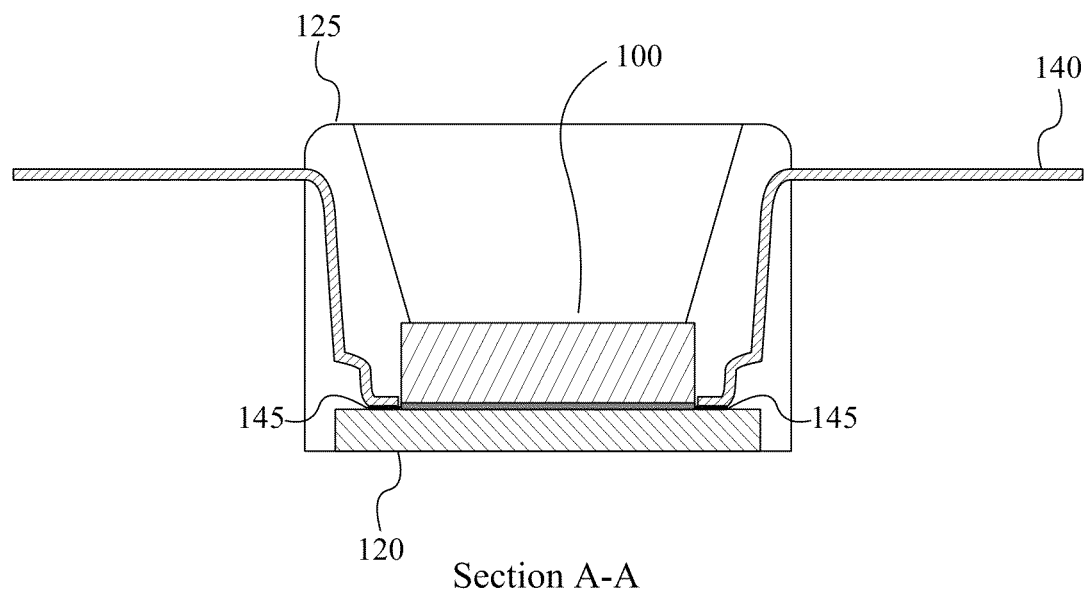
FIG. 2C is a side cross-sectional view of a solar cell module installed in a cowling according to some embodiments.

FIG. 2C is a side cross-sectional view of a mounted solar cell module 150, taken across the line A-A in FIG. 2A, comprising a solar cell module 100 installed in a cowling 125 with conductors 140 soldered 145 to a contact on the solar cell module 100 according to some embodiments.

Figure 3:
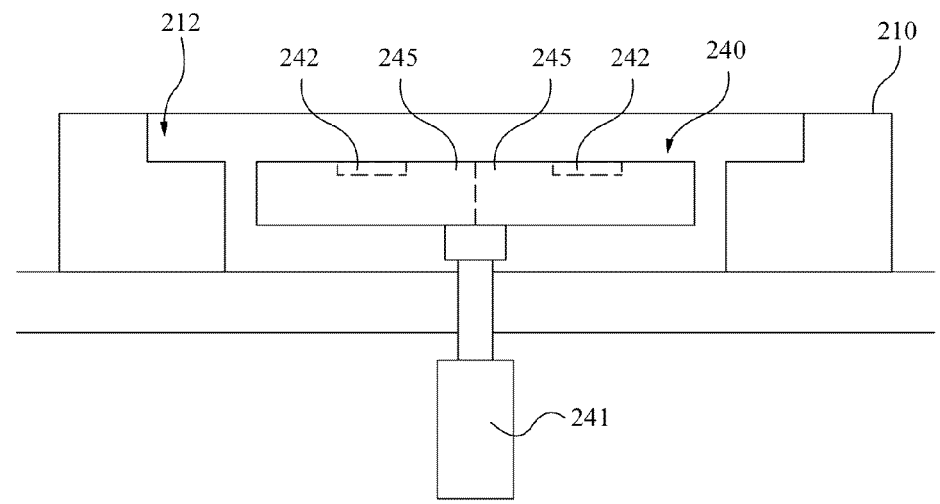
FIG. 3 illustrates a lower assembly of a vacuum reflow voiding rework system according to some embodiments.
Figure 3:
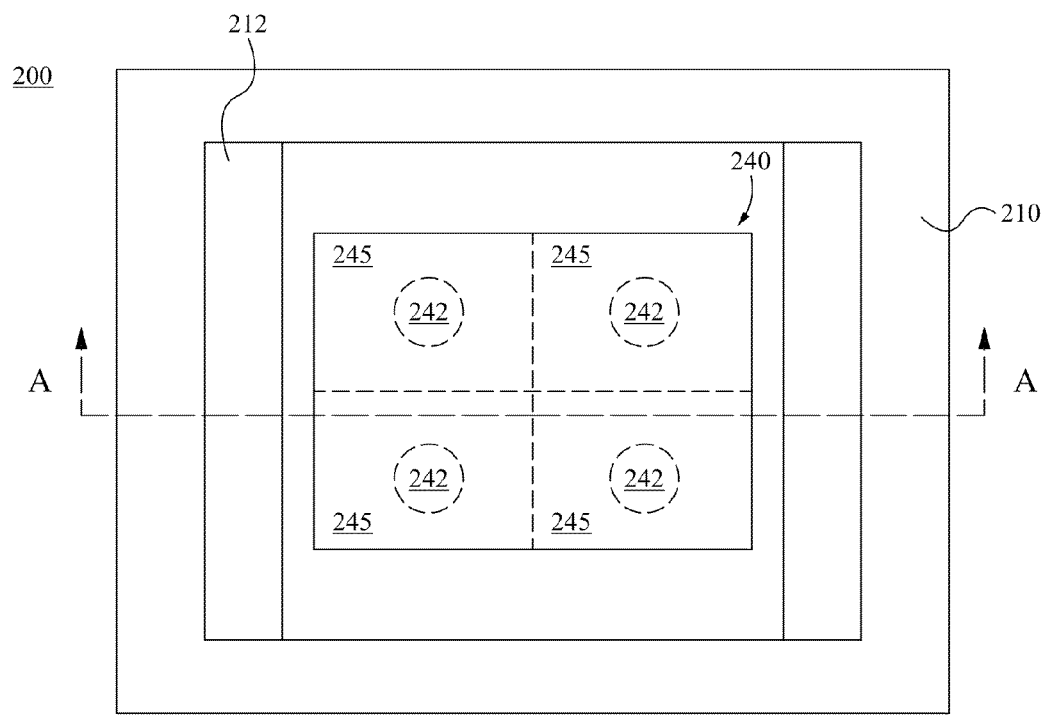

FIG. 3 illustrates a lower assembly 200 of a vacuum reflow voiding rework system 500 according to some embodiments. The top drawing in FIG. 3 is a side cross-sectional view of the bottom drawing taken along the line A-A. The lower assembly 200 comprises a recessed area 212 of a mount 210 that receives the mounted solar cell module 150 (not shown) as described above in FIGS. 2A and 2C. The lower assembly 200 comprises a heat source 240 that is aligned with the location of a solder area 115 (not shown) of a mounted solar cell module 150 (not shown) installed in the recessed area 212 of the mount 210. The heat source 240 comprises a plurality of heat modules 245 each having a sensor 242 for reading the temperature of the associated heat module 245. In FIG. 3, a heat source 240 has four heat modules each marked 245 and having a corresponding heat sensor 242. Each heat module 245 is able to be controlled using a servo algorithm such as a proportional integral derivative gain (PID) servo algorithm or a time proportional control servo algorithm. FIG. 3 illustrates an actuator 241 that can be used to position the heat source 240 under the mounted solar cell module (not shown) and to retract the heating module 240 from the mounted solar cell module (not shown).

Figure 4:
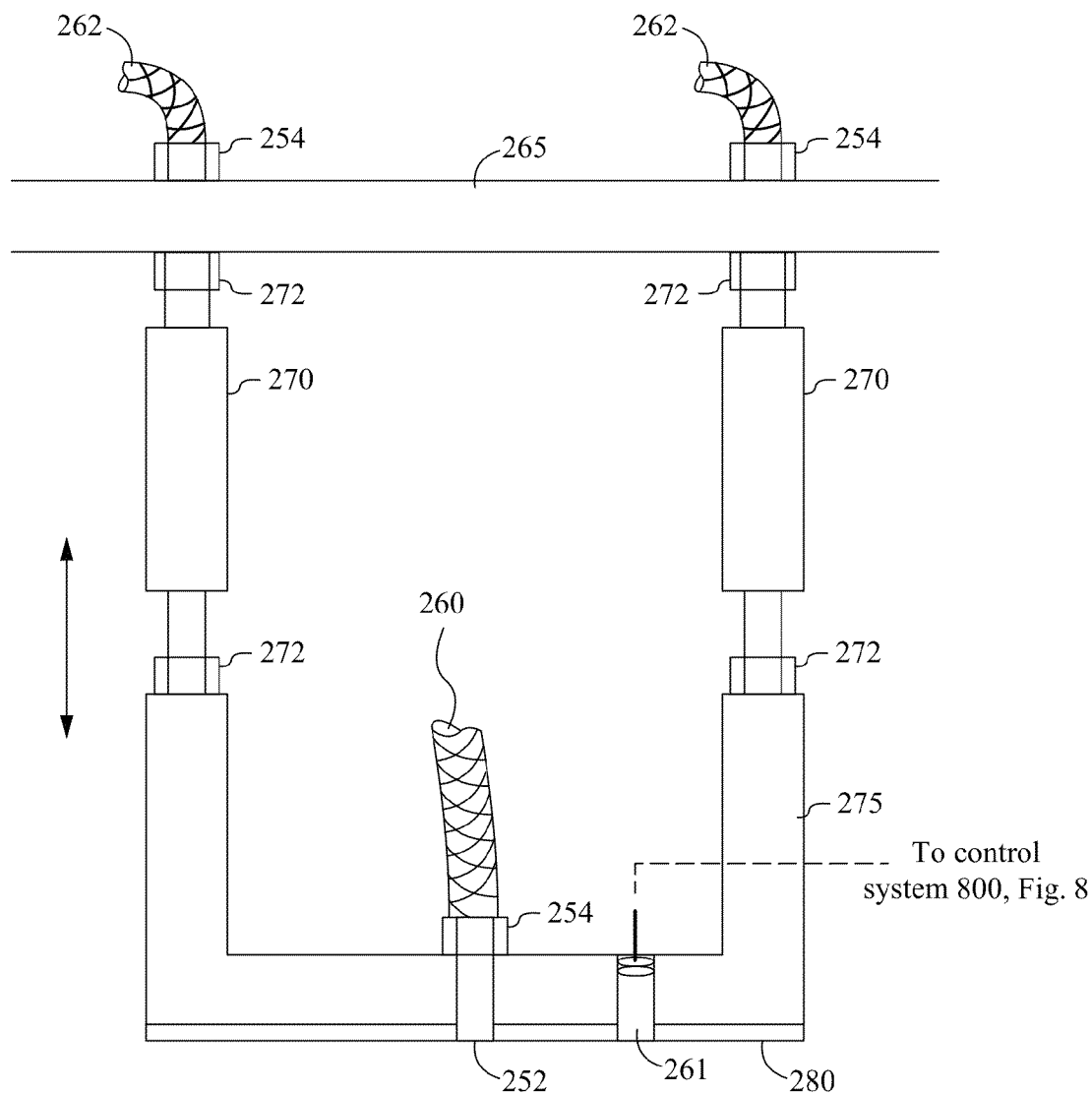
FIG. 4 illustrates an upper assembly of a vacuum reflow voiding rework system according to some embodiments.
Figure 8:
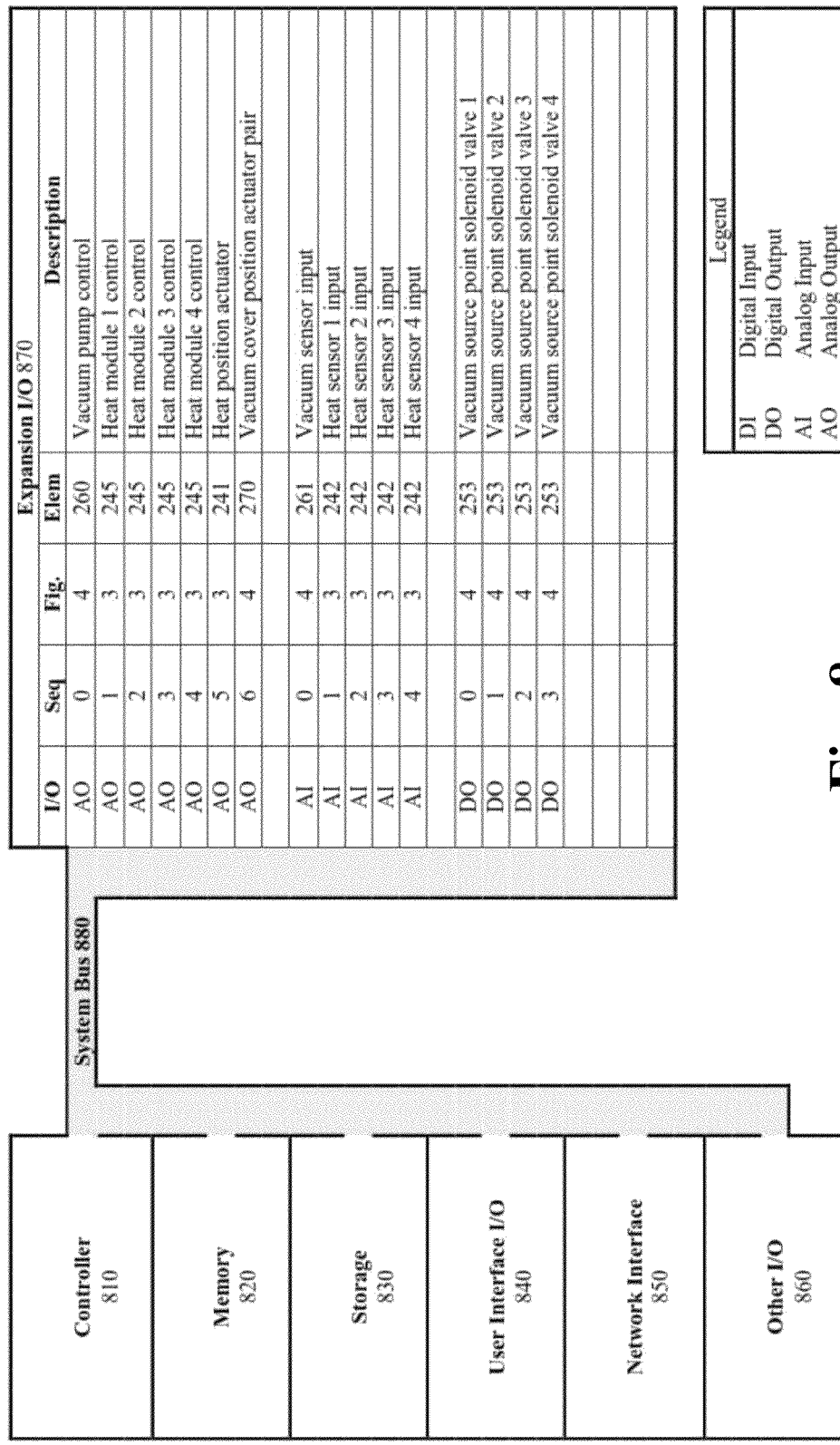
FIG. 8 illustrates a control system for automating a reworking method practiced on a reworking system according to some embodiments.

FIG. 4 illustrates an upper vacuum assembly 250 of a vacuum reflow voiding rework system according to some embodiments. The upper vacuum assembly 250 comprises a retractable vacuum cover 275 coupled to actuators 270 with fasteners 272. The actuators 270 are coupled to an upper frame 265. The actuators 270 can be pneumatically operated using an air supply 262 coupled to the actuators 270 at the upper frame 265 with a fastener 254. The retractable vacuum cover 275 comprises a vacuum source 260 coupled to the retractable vacuum cover 275 with a coupling 254 leading to a vacuum source point 252. The vacuum source point 252 draws a vacuum inside a sealed chamber formed at least in part by the cowling that houses a solar cell module, such as the cowling 125 described in FIGS. 2A and 2C, above. The vacuum source 260 and the actuators 270 are coupled to a control system 800, as shown in FIG. 8 below. The upper vacuum assembly 250 is sealed to a solar module cowling (not shown) when the retractable vacuum cover 275 is lowered onto the cowling (not shown) and sealed by a gasket 280, thereby forming a sealed chamber. A vacuum sensor 261 is coupled to the retractable vacuum cover 275 to sense the vacuum within the sealed chamber. The vacuum sensor 261 output is routed to the control system 800 as described in FIG. 8 below.

Figure 5:
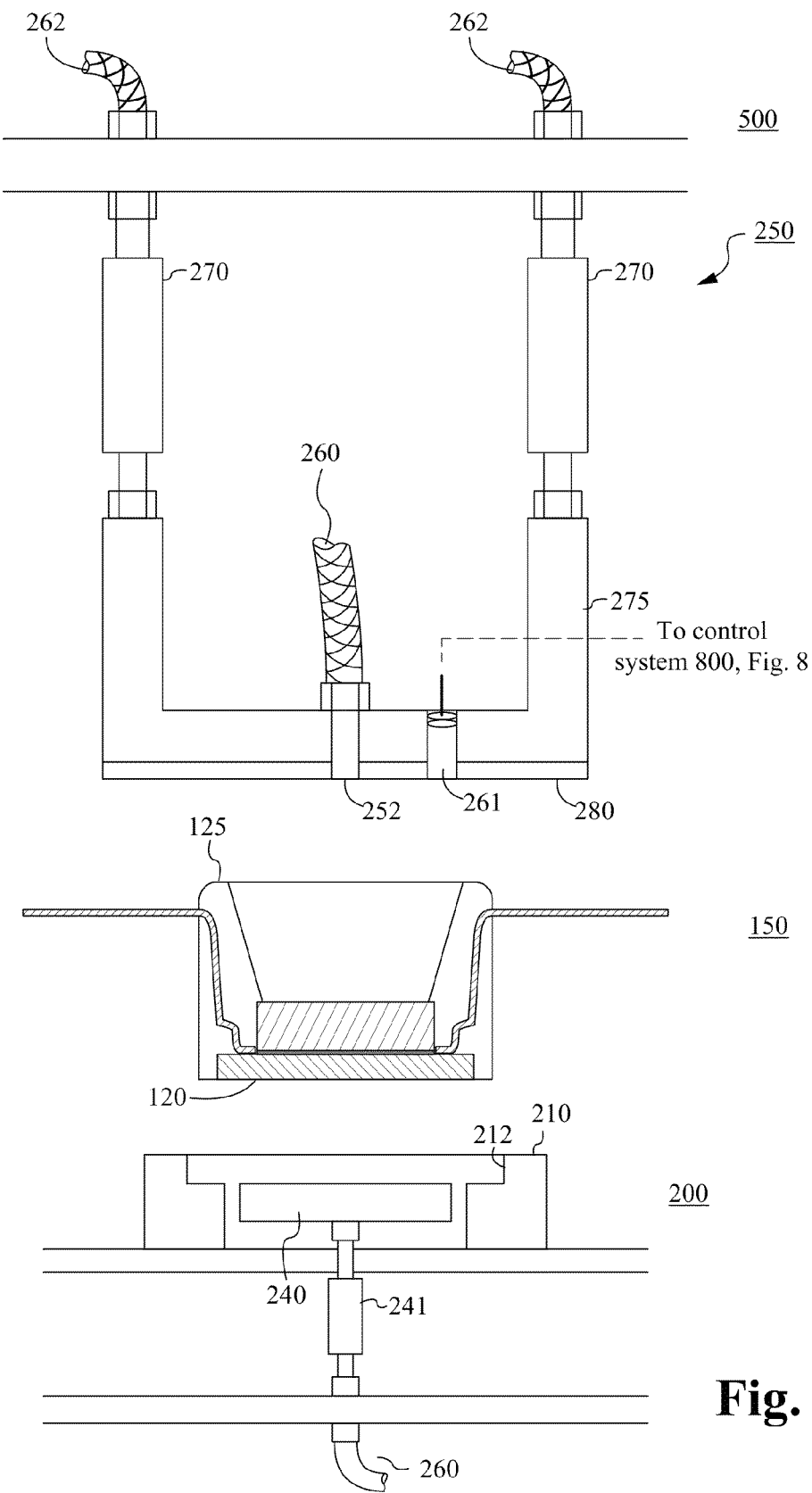
FIG. 5 illustrates a vacuum reflow voiding rework system according to some embodiments.

FIG. 5 illustrates a vacuum reflow voiding rework system 500 according to some embodiments. As shown in FIGS. 3 and 5, the lower assembly 200 comprises a mount 210 with a recessed area 212 to receive a mounted solar cell module 150. The lower assembly 200 further comprises a heater module 240 that is able to be positioned under, and retracted from, the substrate 120 of the mounted solar cell module 150 by an actuator 241. The upper vacuum assembly 250 comprises an upper vacuum cover 275 that can be positioned using actuators 270. The upper vacuum cover 275 further comprises a vacuum source point 252, a vacuum sensor 261, and a gasket 280. Once the mounted solar cell module 150 is placed into the mount 210, the upper vacuum cover 275 can be lowered down to seal with the top of the cowling 125 of the mounted solar cell module 150 using the gasket 280 on the face of the upper vacuum cover 275. The application of vacuum 260 to the vacuum source point 252, monitoring of vacuum with the vacuum sensor 261, and controlling of heat to the heater module 240 is implemented by a control system 800 as shown in FIG. 8. Exemplary methods for vacuum reflow voiding rework are described in FIGS. 6 and 7

Figure 6:
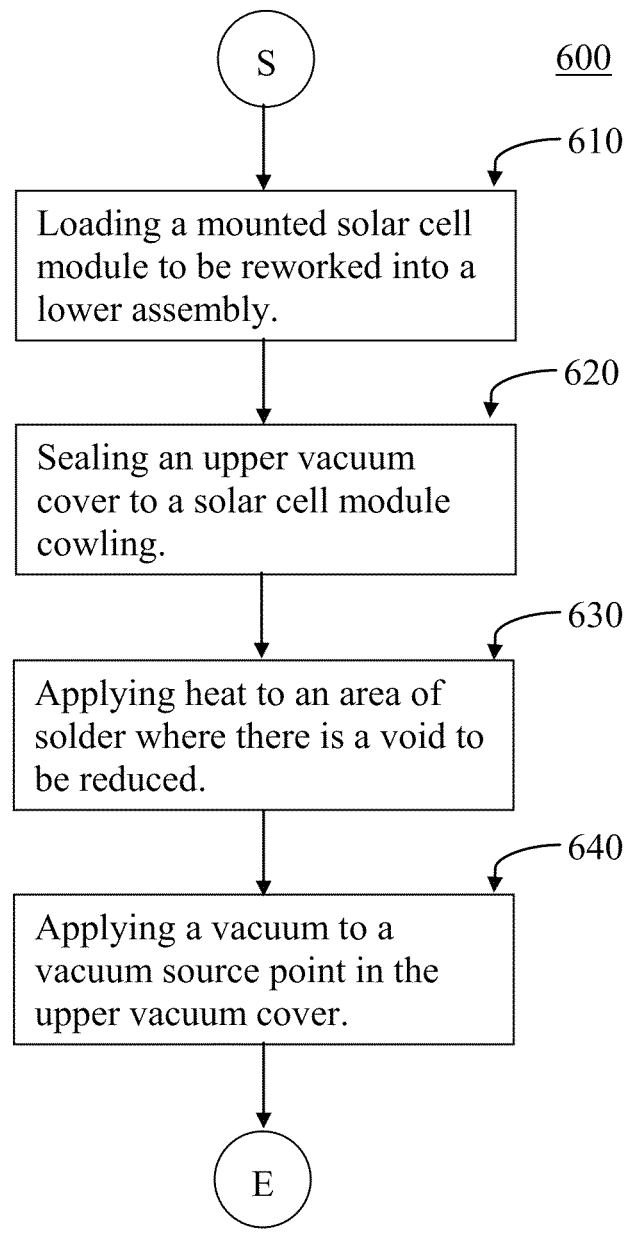
FIG. 6 illustrates the steps of a method of reworking a solar cell module having a void in the solder between a solar cell die and a substrate according to some embodiments.

FIG. 6 illustrates the steps 600 of a method of reworking a mounted solar cell module 150 having a void 110 in the solder 115 between a solar cell die (e.g., 105) and a substrate (e.g., 120) according to some embodiments. The method begins at step 610 wherein a mounted solar cell module 150 to be reworked is loaded into the lower assembly 200 that is described above in FIG. 3. At step 620, the upper vacuum cover 275 is sealed to the cowling 125 of the mounted solar cell module 150 thereby forming a sealed chamber. As is known in the art, an appropriate gasket 280 is used to ensure a good seal between the upper vacuum cover 275 and the cowling 125. At step 630, heat is applied to the solder area 115 to melt the solder so that a void 110 in the solder can be reduced in size or eliminated. The heat can be applied to the solder by heating the substrate upon which the mounted solar cell module 150 is mounted. The heat is transmitted through the substrate and melts the solder. In some embodiments, a mounted solar cell module 150 has heat transfer elements built into the substrate 120 for post-rework coupling to a heat dissipation assembly such as a finned metal heat exchanger. In such assemblies, the heat from the heat source is transmitted to the solder substantially by the heat transfer elements in the substrate, rather than by the substrate material itself. At step 640, a vacuum is applied to the sealed chamber to assist in drawing out air entrapped in the melted solder due to the void in the solder. In the embodiment shown in FIG. 4, the upper vacuum cover 275 comprises a vacuum source point 252. The amount of the vacuum is chosen to help the entrapped air overcome the surface tension of the molten solder so that the void can be reduced in size or eliminated.

Figure 7:
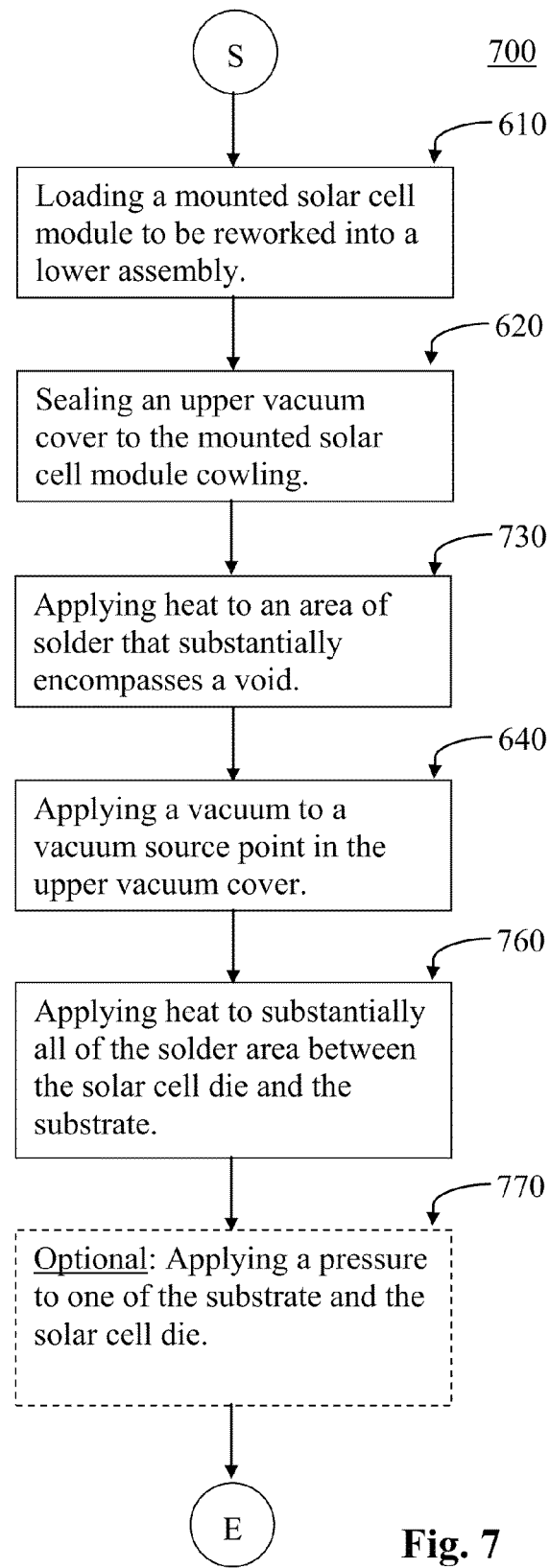
FIG. 7 illustrates the steps of a method of reworking a solar cell module having a void in the solder between a solar cell die and a substrate according to some embodiments.

FIG. 7 illustrates the steps 700 of a method of reworking a solar cell module having a void in the solder between a solar cell die and a substrate according to some embodiments. The steps 700, include the steps 610, 620, and 640 described in FIG. 6. In FIG. 7, the heat source used to apply heat to the solder region comprises a plurality of heating modules that can be controlled independently of each other. At step 730, by selecting an appropriate heating element, heat is applied to a region of the solder area that substantially encompasses a void. The solder around the void is melted so that the void can be reduced by the vacuum applied in step 640. At step 760, heat is applied to substantially all of the solder area between the solar cell die and the substrate so that the resulting reflow of solder will redistribute and achieve a uniform thickness throughout the solder area. To help achieve a uniform thickness of the solder during reflow of the solder, in some embodiments pressure is applied at step 770 to at least one of the substrate and the solar cell die effectively pressing the substrate and solar cell die together.

FIG. 8 illustrates a control system 800 for automating a reworking method practiced on a reworking system according to some embodiments. The control system 800 comprises a controller 810, a memory 820, storage 830, a user interface I/O port 840, a network interface 850, other I/O 860, and an expansion I/O module 870, all communicatively coupled by a system bus 880. The controller 810 executes instructions programmed into the storage 830 and read into the memory 820. The programmed instructions carry out the method steps 600, 700, or both, for reworking a solar cell module to reduce or eliminate solder voids. Other I/O 860 can comprise interrupt lines, timer/counter inputs and outputs, communications lines such as Clocked Serial I/O, I$^2$C, USB, RS232, RS485, and other communications protocols. The expansion I/O module 870 comprises analog inputs (AI), analog outputs (AO), digital inputs (DI) and digital outputs (DO). As shown in FIG. 8, analog outputs control the vacuum pump, the heat position actuator, the upper vacuum cover position actuators, and the one or more heat modules 245. Analog inputs include a vacuum sensor 261 and the one or more heating sensors 242. In embodiments incorporating modulation of the vacuum source, the vacuum source control can be implemented as an interrupt routine from a timer/counter in the other I/O 860. A vacuum sensor 261 is coupled to an analog input to measure the vacuum inside the sealed chamber formed at least in part by the cowling 125. One skilled in the art can conceive of other control schemes exemplified by the control system shown in FIG. 8. A user interface for obtaining user inputs and for providing information to the user can be coupled to the control system via the User Interface I/O port 840.

Figure 9:
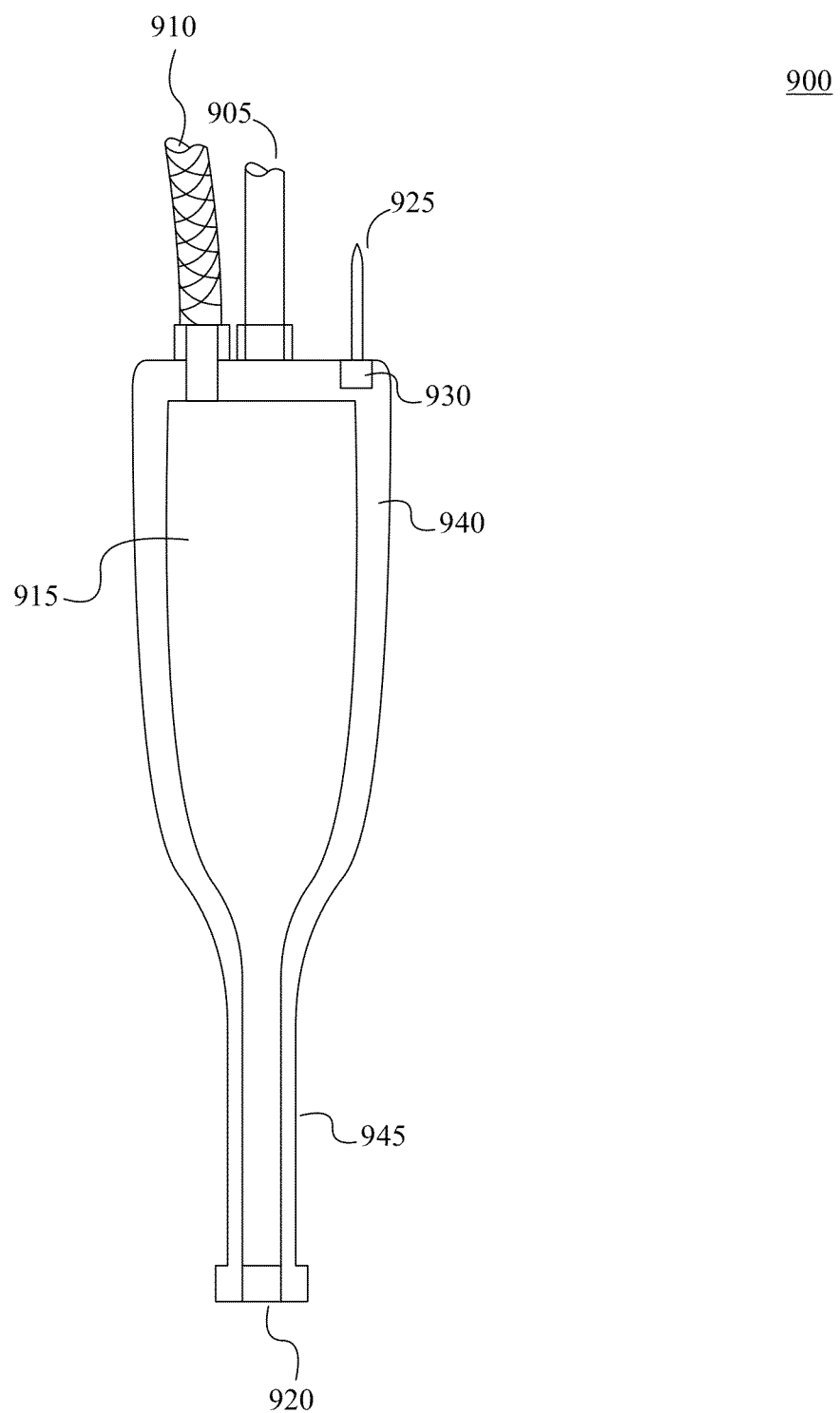
FIG. 9 illustrates a vacuum nozzle for removing excess solder from a substrate surface according to some embodiments.

FIG. 9 illustrates a vacuum nozzle 900 for removing excess solder from a substrate 120 surface according to some embodiments. The vacuum nozzle 900 comprises a body 940, an extended portion 945, and a tip 920. Inside the body 940 is a vacuum chamber 915. A vacuum source 910 is coupled to the body 940 and thereby to the vacuum chamber 915. The vacuum chamber 915 is in fluid communication with the extended portion 945 and the vacuum tip 920. The body 940 further comprises a combination heating element and temperature sensor 930 having a power and a communication cable 925. The body is coupled to a mechanical attachment rod 905 that can be coupled to an X-Y translation stage for precision positioning of the vacuum nozzle 900 in relation to a substrate surface from which excess solder is to be removed. One skilled in the art will recognize that the vacuum nozzle 900 could be implemented as a separate vacuum nozzle and a heated tip. The embodiment in FIG. 9 is preferred because the vacuum chamber 915 is heated as a consequence of heating the entire vacuum nozzle 900 and aids in evacuating the solder from the vacuum chamber 915.

Figure 10:
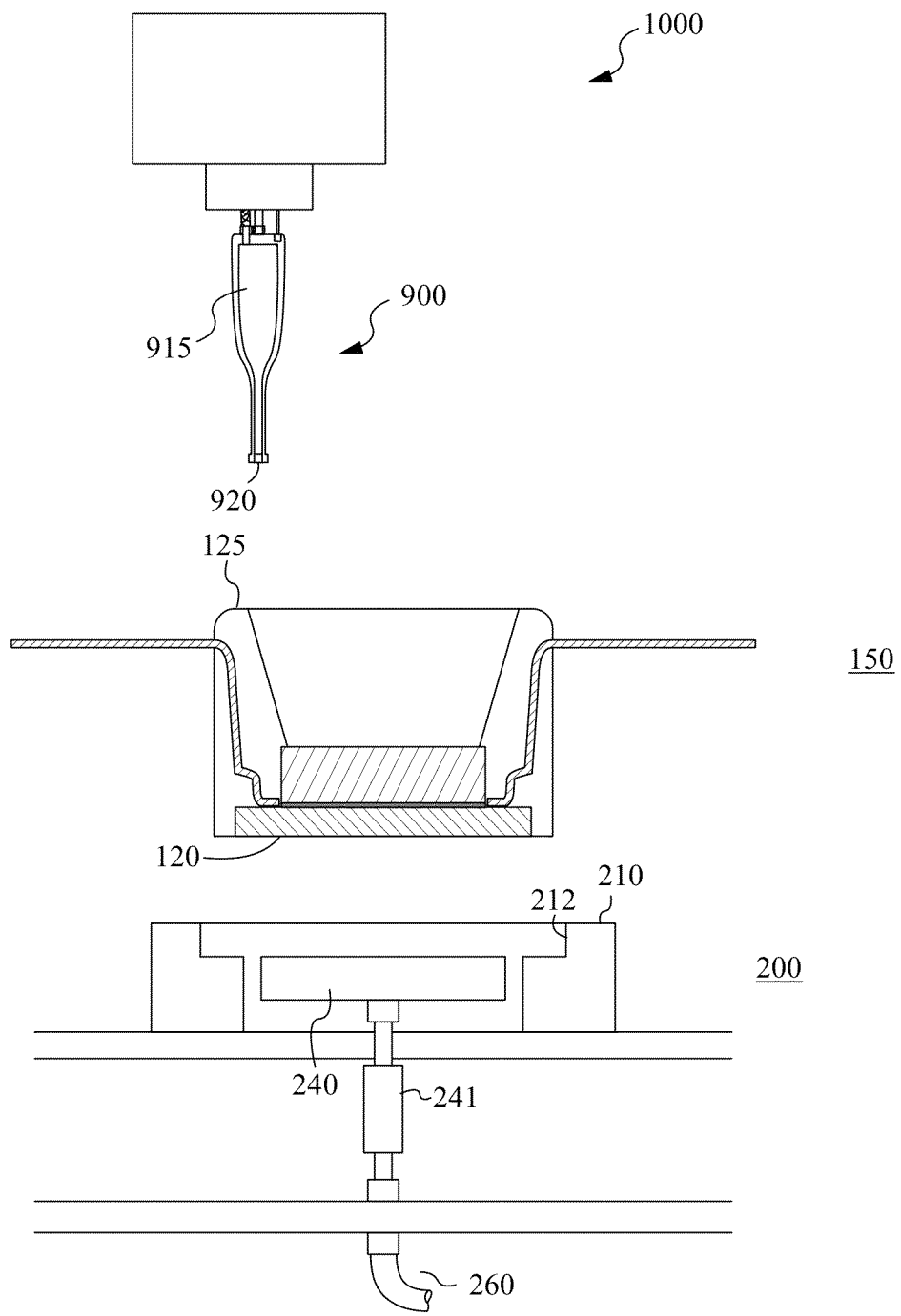
FIG. 10 illustrates a system for removing excess solder from a substrate surface according to some embodiments.

FIG. 10 illustrates a system 1000 for removing excess solder from a substrate surface 120 according to some embodiments. A vacuum nozzle 900 is coupled to a X-Y translation Stage (not shown). As shown in FIGS. 3 and 5, the lower assembly 200 comprises a mount 210 with a recessed area 212 to receive a mounted solar cell module 150. The lower assembly 200 further comprises a heater module 240 that is able to be positioned under, and retracted from, the substrate 120 of the mounted solar cell module 150 by an actuator 241. Once the mounted solar cell module 150 is placed into the mount 210, the vacuum nozzle 900 is positioned at a starting location for a selected area on the substrate 120 from which excess solder is to be removed. The tip 920 of the vacuum nozzle 900 is heated to a melting temperature of the solder to be removed. A vacuum is applied to the vacuum nozzle 900 at vacuum source point 910. The X-Y translation stage (not shown) scans the vacuum nozzle 900 across the selected area, removing solder by melting the excess solder and vacuuming the excess solder into the vacuum nozzle chamber 915 via the vacuum tip 920. An exemplary method for removing excess solder from the substrate surface 120 is described in FIG. 13.

Figure 11:
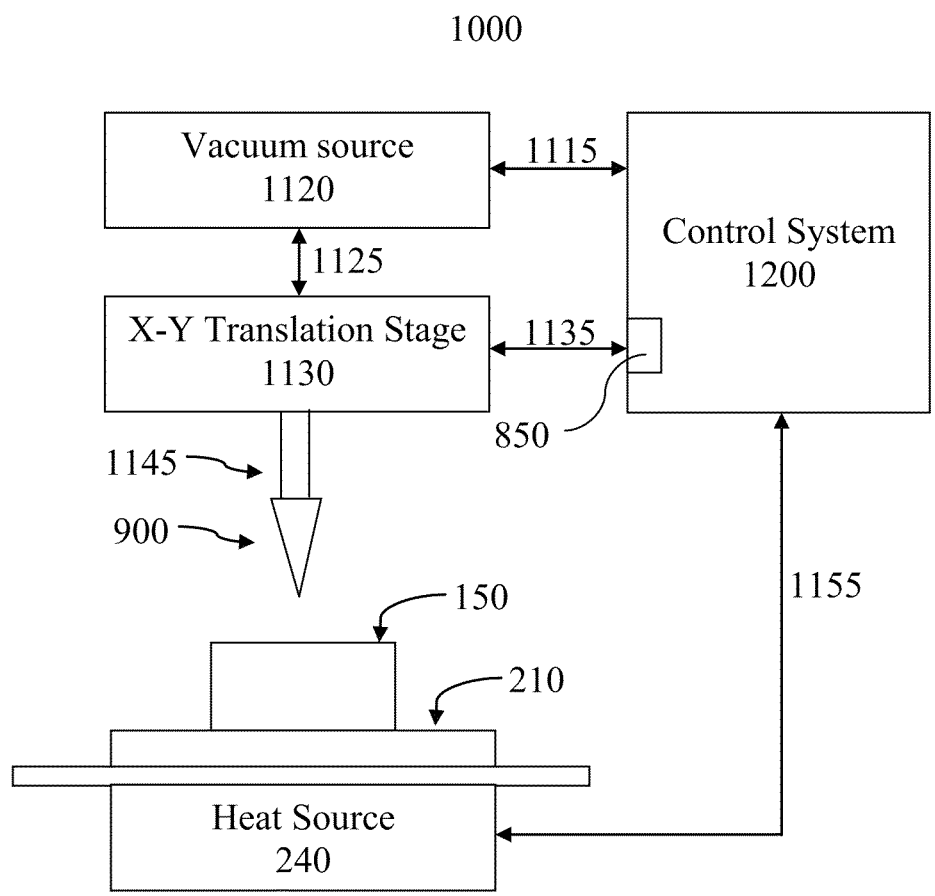
FIG. 11 illustrates the subsystems of a system for removing excess solder from a substrate surface according to some embodiments.
Figure 12:
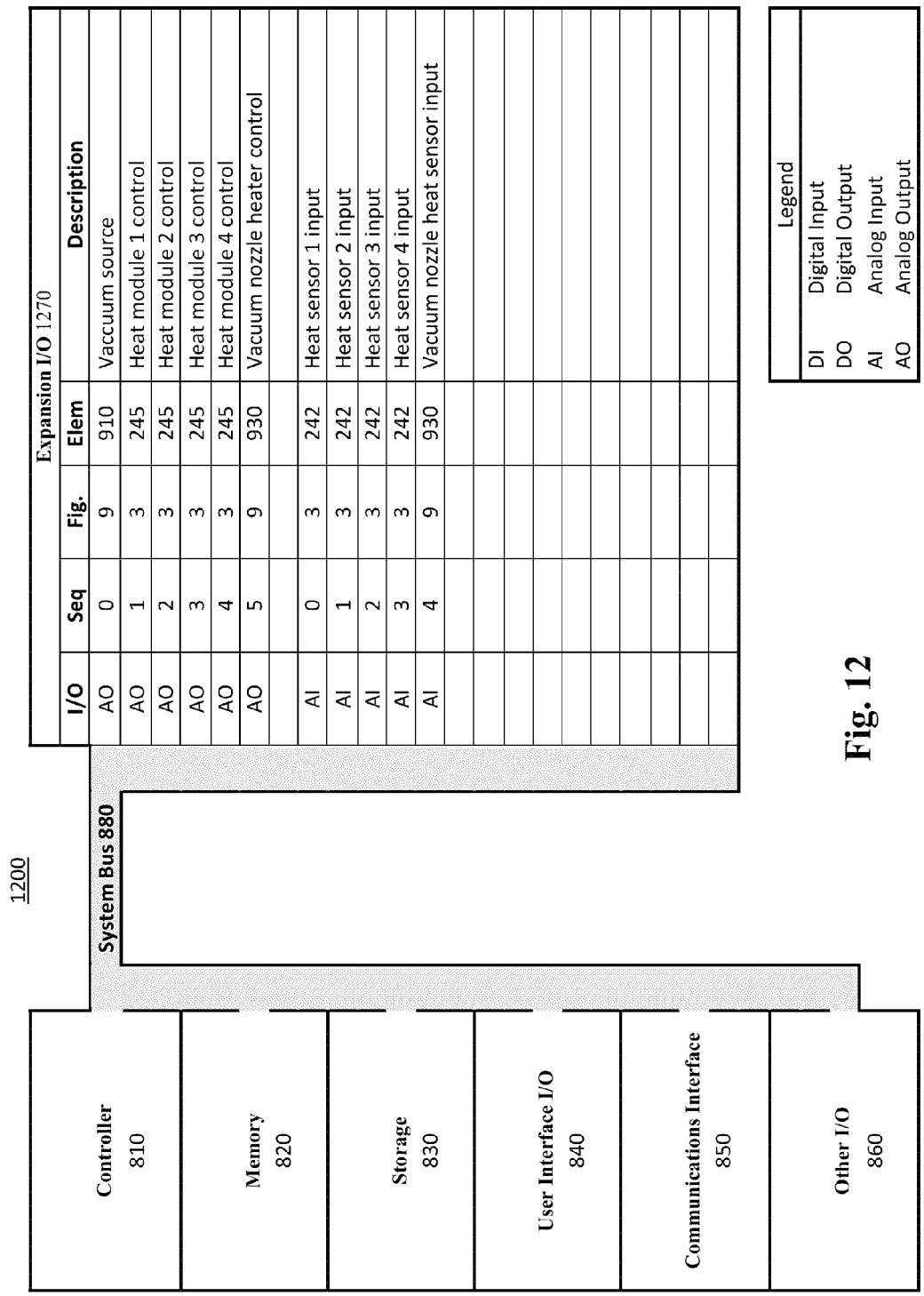
FIG. 12 illustrates a controller subsystem for automating the removing of excess solder from a substrate surface according to some embodiments.

FIG. 11 illustrates the subsystems of a system 1000 for removing excess solder from a selected area of a substrate surface 120 of a solar cell module 150 according to some embodiments. The subsystems of the system 1000 comprises a control system 1200, an X-Y translation stage 1130, a vacuum source 1120, a vacuum nozzle 900, a solar module mount 210, and a heat source 240. The control system 1200 is described in detail in FIG. 12, below. The control system 1200 controls the vacuum source 1120 via control lines 1115. The vacuum source 1120 provides vacuum to the vacuum nozzle 900 via connections 1125 to the X-Y translation stage 1130. One skilled in the art would recognize that the vacuum source 1120 could be coupled directly to the vacuum nozzle 900. The scanning movement of the X-Y translation stage 1130 is controlled by the control system 1200 via the communications interface 850 as shown in FIG. 12, below, through communication lines 1135. Communications lines 1135 further comprise control and monitor signals for the vacuum nozzle 900, the combination heating element and temperature sensor as described in FIG. 9, above, and are coupled to the vacuum nozzle 900 via a coupling 1145 between the X-Y translation stage 1130 and the vacuum nozzle 900. The coupling 1145 comprises a mechanical coupling and further comprises the control and monitor signals for the vacuum nozzle 900 heating source and heating monitor. A solar module 125 is mounted into the mount 210. Optional preheating of the solar module substrate 120 (not shown) and optional heating of the selected area of the substrate 120 for removal of excess solder are controlled and monitored by the control system 1200 via monitor and control lines 1155.

FIG. 12 illustrates a control system 1200 for automating the removing of excess solder from a substrate 120 surface according to some embodiments. The control system 1200 is substantially identical to the control system 800, except that the mapping of Expansion I/O 1270 is slightly different than the Expansion I/O 870. In Expansion I/O 1270, analog outputs comprise a vacuum source 910 control, and individual output control for each of heating modules 1 through 4, as well as a vacuum nozzle combination heat module and temperature sensor 930. Analog inputs comprise heat sensors 1 through 4 corresponding to each of the heat modules 1 through 4, and a vacuum nozzle heat sensor. Each of the analog outputs and inputs is interfaced to, and monitored or controlled by, the controller 810 via the system bus 880. The control system 1200 is interfaced to an X-Y translation stage via the network interface 850.

Figure 13:
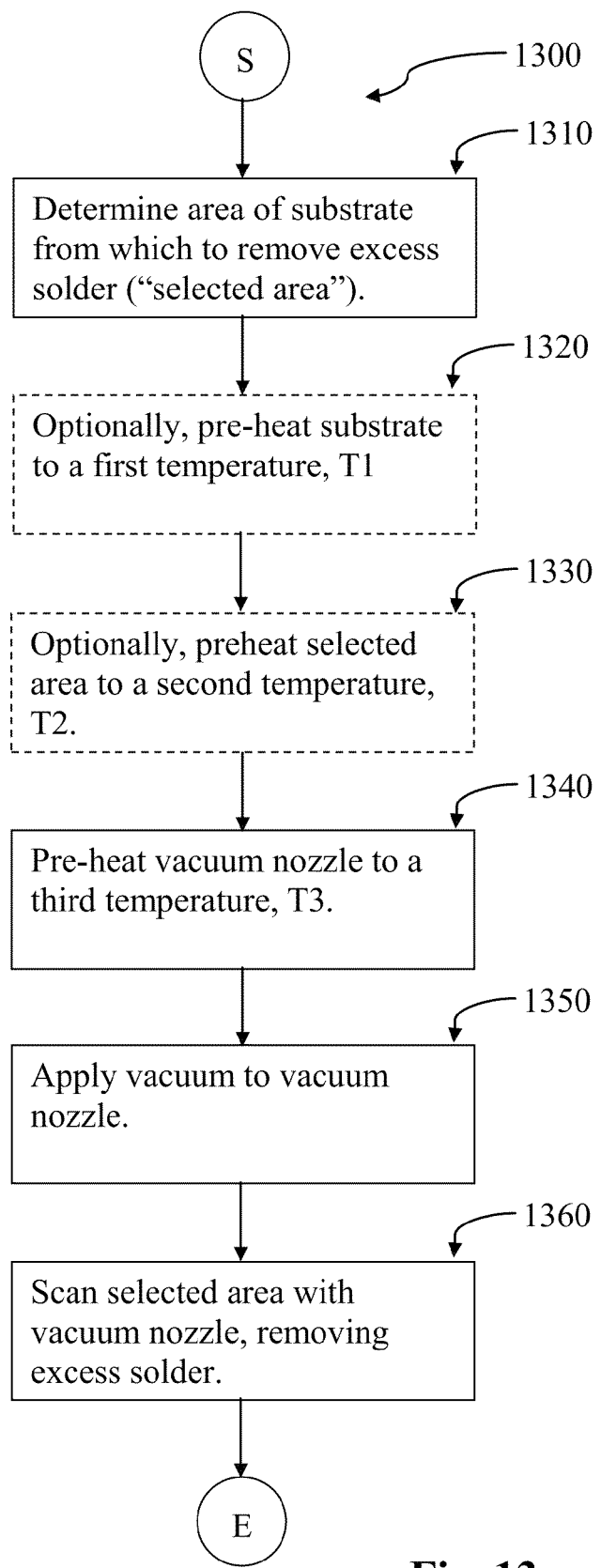
FIG. 13 illustrates a method of removing excess solder from a substrate surface according to some embodiments.

FIG. 13 illustrates the steps of a method 1300 of removing excess solder from a substrate surface according to some embodiments. The method 1300 begins at step 1310. At step 1310 an area of the substrate is determined from which excess solder is to be removed ("selected area"). As described above, the selected area can be input into the system for removing excess solder by an operator of the system. Alternatively, an area can be predetermined from stored information regarding the particular solar module design. In some embodiments, the determination of the selected area can be done analytically, by the system, from analysis of an image of the substrate of the particular solar module. At step 1320, an optional step of preheating the substrate to a first temperature, T1, is performed. Preheating the substrate reduces the temperature gradient between the selected area on the substrate surface where solder will be melted and removed and the temperature of the substrate. At step 1330, an optional step of preheating the selected area to a second temperature, T2, is performed. Typically, T2 is greater than T1. Preheating the selected area further reduces the temperature gradient between the selected area and the surface where solder will be melted and removed. Avoiding a large temperature gradient between the substrate and the selected area, and between the selected area and the point where solder removal occurs, helps reduce defects induced by steep temperature gradients between these elements. Defects can include cracking of solder joints due to cold joints and damage to nearby components. By bringing the temperature of the selected area closer to the melting temperature of the solder, the solder can be melted and removed more quickly, thereby increasing the efficiency of the removal of excess solder. At step 1340, the vacuum nozzle is preheated to a third temperature, T3. The third temperature is equal to, or greater than, the melting temperature of the solder and is greater than the second temperature T2. At step 1350, a vacuum source is activated and a vacuum is applied to the vacuum nozzle such that vacuum force is present at the tip of the vacuum nozzle. At step 1360, the selected area is scanned with the heated vacuum nozzle. The tip of the vacuum nozzle melts the excess solder in proximity of the vacuum nozzle tip and the vacuum at the tip removes the excess solder by vacuum, through the vacuum nozzle tip and into the vacuum nozzle. The method ends when the scan in step 1360 is completed. Steps can be added or deleted, and the steps can be executed in different orders. For example, optional steps 1320, 1330 and the pre-heating step of 1340 can be performed simultaneously, or in other orders.

Heating Means

Inside the lower assembly, a heat source is disposed in a manner to thermally couple to a solder area of a solar cell soldered to a substrate. The heat source is controlled, preferably, by a control system as described above, to melt all or a portion of the solder area to reduce a void in the solder by evacuating air trapped in the void and reflowing the solder. The heat source can comprise a resistance element and a current driver. The heat source is preferably controllable over a temperature range from ambient to 400° C. For solders with a lower melting point, a high-powered Peltier thermoelectric cooler can be used to both heat the solder up to about 200° C. and to cool the solder rapidly. Heating can also be achieved by a pulsed or continuous wave laser. Other heat sources include those fluidly coupled to the sealed vacuum chamber, such as a heated atmosphere, a plasma, or flame. Further, a heating source can be thermally coupled to the sealed vacuum chamber, such as a heated atmosphere or fluid. The heat source can further comprise a heat sensor for each heat module, the heat sensor providing closed loop feedback for accurate control of the corresponding heat module. A heat module can be controlled using a servo algorithm such as a proportional, integral, derivative (PID) servo or a time proportional control servo. As described above, the heat source can be provided on an actuator that positions the heat source to be coupled to the substrate of a solar cell module. The heat source can be preheated to a predetermined temperature prior to positioning the heat source to thermally couple with the substrate. Alternatively, the heat source can be coupled to the substrate then brought to a predetermined temperature. The heating process can further comprise preheating the heat source to a first temperature prior to thermally coupling the heat source to the substrate, then heating the heat source to a second temperature after coupling the heat source to the substrate. Such process steps can be programmatically accomplished using the control system 800 described in FIG. 8. One skilled in the art will recognize other heat control algorithms that can be used in accordance with the embodiments.

Vacuum Control Means

A vacuum force can be applied to the sealed chamber formed by the substrate, cowling, and upper vacuum cover using a vacuum pump. In some embodiments it is preferable to modulate the vacuum within the chamber to aid in evacuating air entrapped in the solder void region. By modulating or pulsing the vacuum, a motive force is generated in the air in the void that aids in overcoming the surface tension of the melted solder to evacuate the void. Alternatively, a positive pressure can be momentarily injected into the sealed chamber while the vacuum force remains constant. The net result would be a modulating or pulsing of the vacuum force inside the sealed chamber.

Pressure Control Means

A pressure force can be applied to one or both of the solar cell die and the substrate. Such pressure force can be by mechanical means applied to the solar cell die, against the substrate. After a solder void has been reduced and the reflow of solder has begun, the vacuum in the vacuum chamber can be released and a pneumatic pressure can be applied to the sealed vacuum that presses the solar cell die and substrate together to promote uniform thickness of the solder during solder reflow.

Programmed Cycle Operation

A reworking operation can be performed using a pre-programmed cycle based upon variable inputs, some of which can be pre-programmed into the controller 810. Variables include the characteristics of the void(s) in the solder such as size, shape, and location within the solder area. Other variables include the solder material thickness, material composition and melting point, and the substrate material, thickness and thermal conductivity. Some of these variables will be relatively constant based upon the specifications of a particular solar cell module. An operator of a reworking system can select a particular solar cell module type with preprogrammed specifications for reworking. The operator further examines the nature of the voids in the solder and positions the mounted solar cell module into the lower assembly. Based upon the operator examination, the operator further can choose a particular vacuum pressure at the vacuum source point within the chamber. The operator can further choose whether to heat the entire solder area at once, or to heat one or more selected areas to reduce void(s) before reflowing the entire solder area. Other parameters include a heat source ramp rate, cycle duration, vacuum force setting, vacuum source modulation rate and magnitude, heat source ramp down rate, cooling rate for Peltier heat sources, and cycle duration.

Actuator Means

As described above, the heater module 240 can be positioned under, and retracted from, the underside of the substrate 120 of a mounted solar cell module 150 in the lower assembly mount 210 by means of an actuator 241. As also described above, the upper vacuum cover 275 can be positioned onto, and retracted from, the cowling 125 of a mounted solar cell module 150 by means of actuators 270. In FIGS. 3-5, the actuators 241 and 270 are shown as pneumatic actuators, driven by air sources 260 and 262. One skilled in the art will recognize that the actuators could alternatively be hydraulically operated, electrically operated, or manually operated.

Scanning Means

The X-Y translation stage is preferably encompassed in a CNC machine. Scanning an area on the substrate means moving the vacuum nozzle across the surface of the area to be scanned such that substantially all of the area to be scanned is exposed to the heated tip of the nozzle and the vacuum force at the tip of the nozzle. Excess solder is removed by the heated tip of the vacuum nozzle melting the solder, and the vacuum at the tip of the vacuum nozzle drawing the melted solder into the vacuum nozzle. The area can be scanned by breaking the area up into rows that are sequentially scanned and moving the nozzle to a next row until all rows representing the area have been scanned by the vacuum nozzle. If the area to be scanned is determined to be non-rectangular, an irregular scanning pattern, such as where rows are of unequal length, can be used. The area to be scanned can be determined by manual input, by analysis of an image of the substrate, or by a preprogrammed scan pattern for a particular solar module configuration.

Rework Process Improvement

The process described for removing excess solder is a reworking process that remedies defects in the solder reflow process also described herein. Regardless of the method by which the area to be scanned is determined, the scan area can be stored and compared against previous and subsequent reworking scan areas to determine defect patterns resulting from the solder reflow process. By analysis of such patterns, defects in the reflow process can be determined and improvements made in the reflow process, thereby reducing the need for removal of excess solder and improving the overall output and quality of the reworking process.

In operation, a method of removing excess solder from an area of a substrate comprises scanning the area with a vacuum nozzle that is heated to a temperature that will melt the excess solder. A vacuum source is coupled to the vacuum nozzle and is actuated to provide a vacuum at the tip of the vacuum nozzle. The vacuum nozzle is coupled to an X-Y translation stage of a CNC machine to scan the area where solder is to be removed. A heat source is located under the substrate and is heated to a temperature sufficient to heat the substrate so that the temperature gradient between the heated area being scanned, and the substrate, is minimized. Preferably, the heat source comprises a plurality of heating modules, each independently controllable and monitorable. A heating module that substantially encompasses the area to be scanned is heated to a temperature that is less than the solder melting temperature and is typically greater than the temperature at which the remainder of the substrate is heated. This facilitates rapid melting of solder at the tip of the vacuum nozzle without unduly heating the remainder of the substrate. Preferably, a controller is programmed to execute the scanning process. The controller can be preprogrammed with the areas to be scanned for a particular solar module configuration. Alternatively, an operator can input areas on the module substrate to be scanned. In a more automated embodiment, the controller is configured to receive an image of the substrate and the image is analyzed to determine the area to be scanned. Ideally, the analysis identifies only the areas of the substrate where excess solder needs removal, thereby increasing the efficiency of the solder removal process.

The present invention has been described in terms of specific embodiments incorporating details to facilitate the understanding of principles of construction and operation of the invention. Such reference herein to specific embodiments and details thereof is not intended to limit the scope of the invention. It will be readily apparent to one skilled in the art that other various modifications are able to be made to the embodiments chosen for illustration without departing from the spirit and scope of the invention as defined by the appended claims.

What is claimed is:

1. A method of removing excess solder from an area on a surface of a substrate, using a machine comprising an X-Y translation stage, the method comprising:
    identifying a first area from which excess solder needs to be removed;
    pre-heating the substrate to a first temperature;
    pre-heating the first area and the excess solder on the first area, but not the entire substrate, to a second temperature that is greater than the first temperature;
    heating a vacuum nozzle having a tip to a third temperature that is greater than the first temperature and the second temperature and is equal to or greater than a melting temperature of the solder;
    applying a vacuum to the vacuum nozzle;
    positioning the tip of the vacuum nozzle at substantially the surface of the substrate; and
    scanning the first area on the substrate to remove the excess solder.

2. The method of claim 1, wherein the first area is predetermined.

3. The method of claim 2, wherein the first area is predetermined by an operator of a machine configured to implement the method.

4. The method of claim 2, wherein the first area is predetermined by a machine configured to implement the method.

5. The method of claim 4, wherein the first area is predetermined by a machine configured to implement the method by analyzing an image of the substrate.

6. The method of claim 1, wherein scanning the first area comprises the machine translating the vacuum nozzle at least in the X-Y plane.

7. The method of claim 1, wherein pre-heating the first area precludes heating the entire substrate.

8. The method of claim 1, further comprising, prior to pre-heating the substrate:
    positioning a solar cell housing in a recessed area of a mount, wherein the solar cell housing includes a module mounted within the housing such that an opening is formed at a top of the solar cell housing when the module is within the housing, wherein the module includes a substrate and a component soldered to the substrate.

9. The method of claim 8, further comprising, after positioning a solar cell
    housing and prior to pre-heating the substrate:
    lowering a vacuum cover down onto the solar cell die housing, thereby forming a sealed chamber from the solar cell housing, the vacuum cover and the substrate, and wherein when the vacuum cover is lowered down onto the solar cell die housing within the module mounted therein, a bottom surface of the vacuum cover that interfaces with the solar cell housing extends beyond the perimeter of the opening.

10. The method of claim 9, further comprising, after lowering a vacuum cover and prior to pre-heating the substrate:

extending the heat source from within the mount towards the module without extending the mount; and transmitting heat from the heat source.

11. A method of removing excess solder from an area on a surface of a substrate, using a machine comprising an X-Y translation stage, the method comprising:

identifying a first area on the substrate from which excess solder needs to be removed;

pre-heating the substrate to a first temperature;

pre-heating the first area but not the entire substrate to a second temperature that is greater than the first temperature such that the temperature differential between the first area and a location of the excess solder is smaller than the temperature differential between area outside the first area on the substrate and the location of excess solder;

heating a vacuum nozzle having a tip to a third temperature that is greater than the first temperature and the second temperature and is equal to or greater than a melting temperature of the solder;

applying a vacuum to the vacuum nozzle;

positioning the tip of the vacuum nozzle at substantially the surface of the substrate; and scanning the first area on the substrate to remove the excess solder.

12. The method of claim 11, wherein the location of excess solder is in the first area.

* * * * *